United States Patent [19]

Dolan

[11] Patent Number: 4,566,170
[45] Date of Patent: Jan. 28, 1986

[54] METHOD OF PRODUCING A LIGHT EMITING DIODE ARRAY

[75] Inventor: Donald T. Dolan, Ridgefield, Conn.

[73] Assignee: Pitney Bowes Inc., Stamford, Conn.

[21] Appl. No.: 493,189

[22] Filed: May 10, 1983

[51] Int. Cl.⁴ .................. H01L 21/98; H01L 33/00
[52] U.S. Cl. .................. 29/569 L; 29/589; 340/782; 357/17
[58] Field of Search .............. 29/569 L, 589, 831, 29/834; 340/782; 357/81, 17

[56]  References Cited
U.S. PATENT DOCUMENTS 3,558,974  1/1971  Stewart .................. 340/782 X
3,860,949  1/1975  Stoeckert et al. ........... 29/589 X
4,406,054  9/1983  St. Louis .................. 29/589 X
4,455,562  6/1984  Dolan et al. ............... 346/154

Primary Examiner—Brian E. Hearn
Assistant Examiner—Alan E. Schiavelli
Attorney, Agent, or Firm—Peter Varhotes; William D. Soltow, Jr.; Albert W. Scribner

[57] ABSTRACT

Light Emitting Diodes (LED) arrays are made by first applying LED monoliths to a metallic pallet, such as a copper pallet, and then securing the pallets to a substrate in a preferred geometrical arrangement. Because copper is so readily machinable, one is able to produce sizes as required for the geometry of an LED array and because of the rigidity, the problem of the fragile modules is removed since they are part of the pallets.

5 Claims, 5 Drawing Figures

METHOD OF PRODUCING A LIGHT EMITTING DIODE ARRAY

BACKGROUND OF THE INVENTION

In the field of electronic non-impact printers, a number of different types of devices have been developed. These include laser printers, thermal printers, ink jet printers and the like. One such device that shows great promise is the light emitting diode (LED) printer. In such a device, an array of LEDs is positioned to address a photoreceptive surface so that when the latter is charged exposing the surface to light from the LEDs will discharge locations on the photoreceptor so as to produce an image composed of small dots of uncharged areas. The LEDs are enabled selectively by electronic drivers in response to a binary coded input to produce an image representative of information being transmitted. In a process known as reversed development, the image on the photoreceptor is developed by a toner material which may then be transferred to the record member.

As in any other system, the LED printer does have its problem areas. One such problem involves the materials from which LED arrays are produced. A chip, made of a material such as gallium arsenide (GaAs), is selectively doped to produce an LED site once anode and cathodes are connected to such doped sites. Such chips with LED sites are generally referred to as monoliths. These monoliths may be attached in tandem to a substrate, such as aluminum oxide, so as to produce an array of LEDs. The monoliths may be attached to the substrate by an adhesive such as epoxy resin. The monoliths must be laid next to one another in a rather precise fashion so that the cathodes of the respective modules are not so close as to short across one another. It is, therefore, necessary to have a relatively wide gap between epoxy areas when placing the LED monoliths directly on a substrate. Problems often arise because the ends of the monoliths are unsupported and, when wire bonded, will have a tendency to crack. Another problem that arises is that aligning the monoliths is difficult since they are required to be placed within ±0.0005 in. and moving them around causes the adhesive to move and create shorts. A still further problem is that replacement of a defective monolith is difficult because of the brittle nature of the gallium arsenide material from which the monoliths are made. As is well known, such material has a tendency to readily fracture.

SUMMARY OF THE INVENTION

It has been found that LED arrays may be made in a convenient and reliable manner by first applying the LED monoliths to a metallic pallet, such as a copper pallet, and then securing the pallets to a substrate in a preferred geometrical arrangement. Because copper is so readily machinable, one is able to produce sizes as required for the geometry of the LED array. Furthermore, because of the rigidity of the resulting structure, the problem of the fragile monoliths is removed since they are secured to and protected by the pallets.

DETAILS OF THE DESCRIPTION

Figure 2:
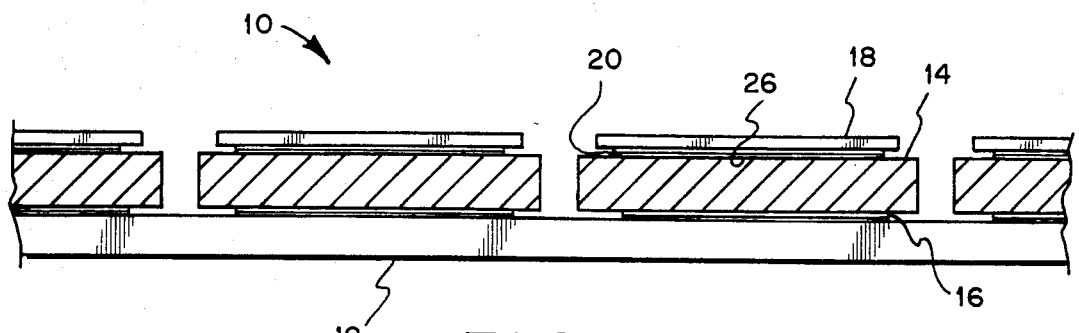
FIG. 2 is a cross sectional view of the LED array taken along the lines 2—2 of FIG. 1.
Figure 1:
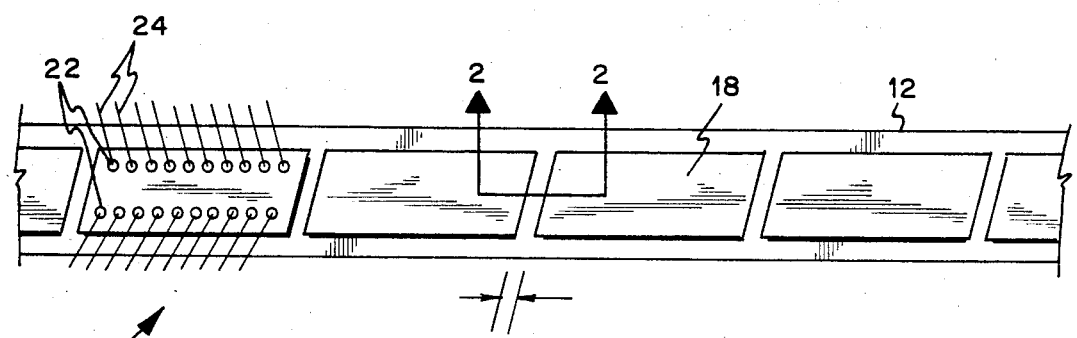
FIG. 1 is a plan view of an LED array manufactured in accordance with the instant invention method.

An LED array is shown generally in FIG. 1 and a detailed cross sectional view of a portion thereof is shown in FIG. 2. For the purposes of the description of the instant invention and the appended claims, an LED array is defined as a structure having a plurality of light emitting diodes which may be selectively enabled when attached to appropriate electronic drivers. Such LED arrays and their use are described in copending applications having Ser. Nos. 162,968 (now abandoned) and 292,985 (now U.S. Pat. No. 4,455,562) filed June 29, 1980 and Aug. 14, 1981, respectively, to which reference may be had for details of such an LED array. Since such detail of an assembled LED does not form part of the instant invention, the same will not be described except to the extent necessary for one skilled in the art to practice the instant invention. The LED array is shown generally at 10 and includes a longitudinal substrate 12 which may be a ceramic member such as $Al_2O_3$ or a PC board. A metallic pallet 14, preferably a copper pallet, is secured to the substrate 12 by an adhesive 16 such as silver epoxy. The thickness of the epoxy is preferably approximately one mil. Secured to each copper pallet 14 is a chip containing a plurality of light emitting diode sites 22, hereinafter referred to as a monolith 18. The monoliths 18 are secured to the copper pallets 14, again, by an adhesive such as a one mil thickness of epoxy resin 20. The monolith 18 may be made of a semiconductor material such as gallium arsenide and has a plurality of doped sites 22 to which anode leads 24 are attached thereby forming LED sites. Cathode connections consist of a common metallic backing coating 26 which is electrically connected through the epoxy layer 20. Although only a few LED sites 22 are shown, it will be appreciated that a much larger number will exist in practice. The preferable number of LED sites 22 on a monolith 18 being 32 to 128. As seen in FIG. 1, there are two rows of LED sites on each monolith 18 but it will be appreciated that the monoliths may contain any number of rows. As seen in FIG. 1, the copper pallets 14 are laid end-to-end with a one-to eight mil gap, depending upon design (i.e. 2, 4 or 6 rows), therebetween upon the substrate 12 so as to form a row of linearly aligned monoliths 18. With the epoxy adhesive 16 bonding the pallets 14 to the substrate 12, an LED array is formed. Although the LED array 10 shown in FIG. 1 is made up of four monoliths 18, it will be appreciated that any number may be used and in practice such an LED array is approximately eight and one-half inches long so as to correspond to the width of text on business size paper and contains 2048 LEDs.

Figure 5:
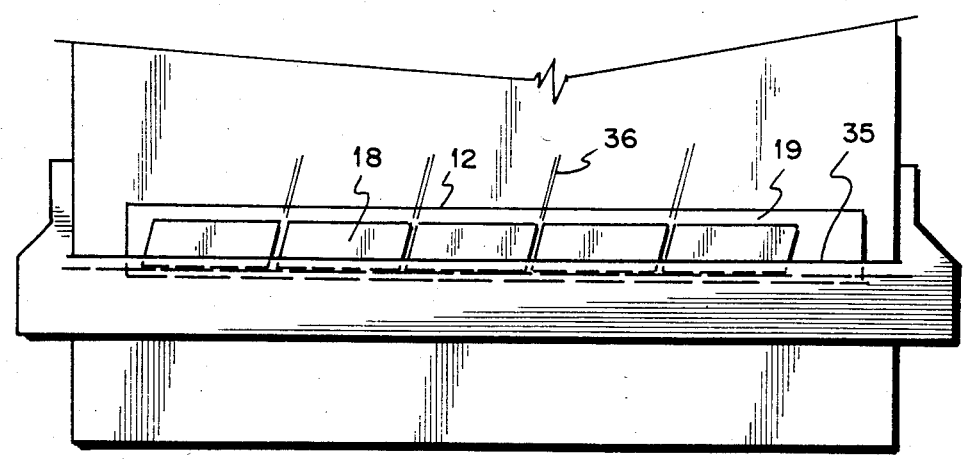
FIG. 5 is a plan view of plurality of monoliths being assembled.
Figure 3:
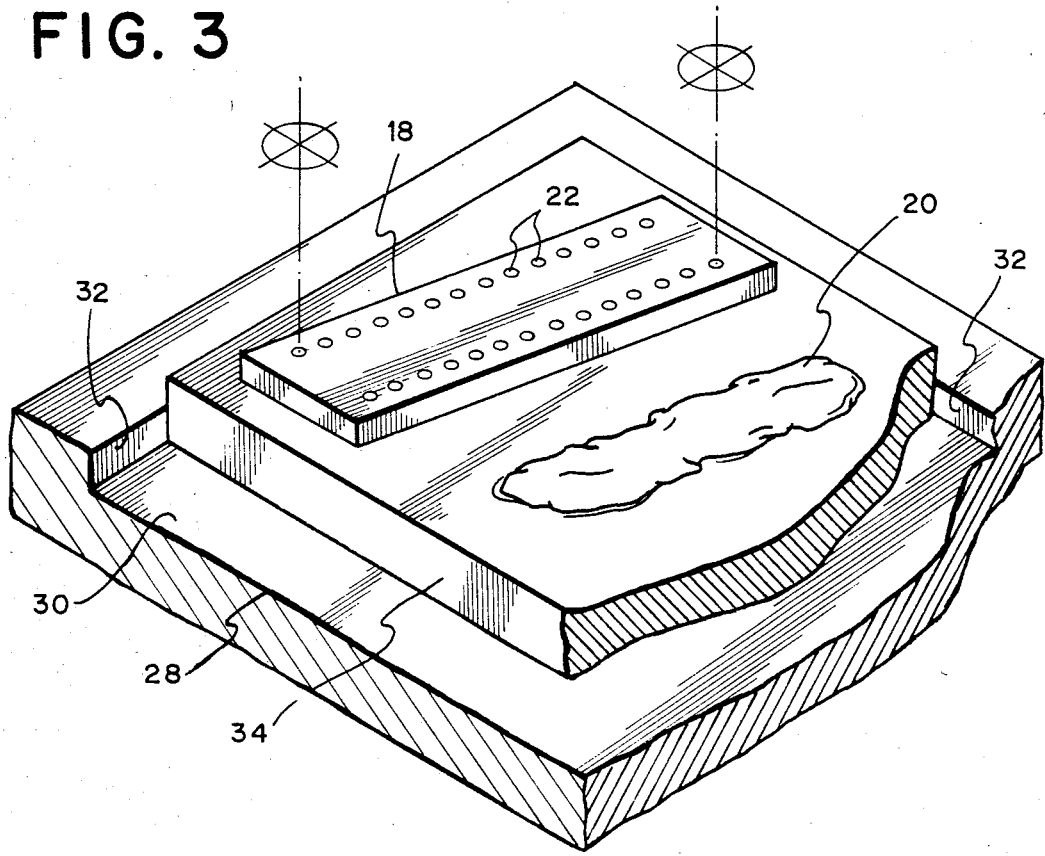
FIG. 3 illustrates a step in the method of making an LED array involving alignment of individual monoliths on a metal plate.
Figure 4:
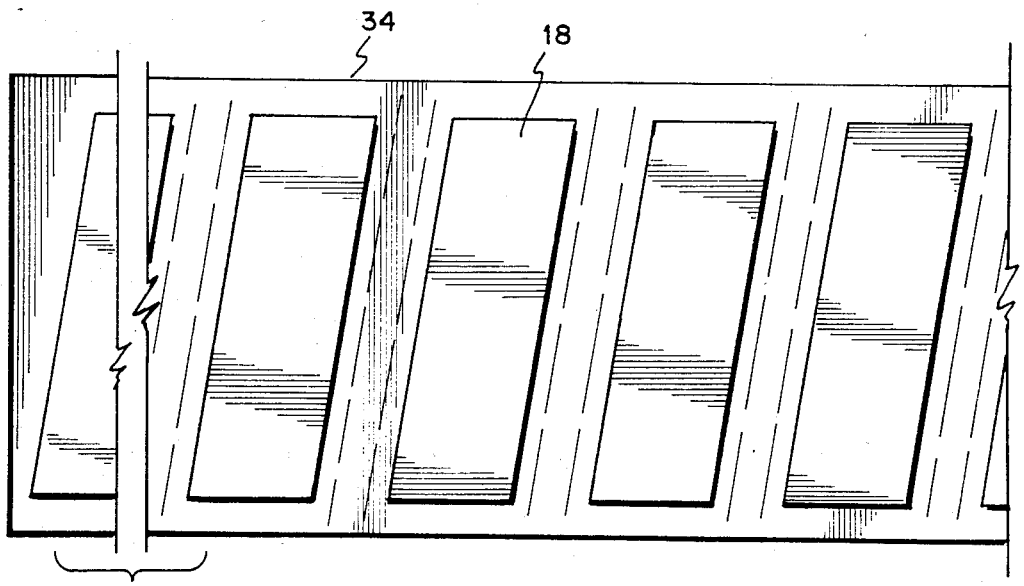
FIG. 4 is a perspective view of a step in the construction of an LED array in accordance with the instant invention.

Referring now to FIGS. 3-5, a description will be given as to a preferred method in which the LED array 10 shown in FIGS. 1 and 2 may be constructed. Referring initially to FIG. 3, a fixture 28, only a portion thereof being shown, is provided that has a recess 30 therein. The recess 30 has a pair of side edges 32 that form a right angle. The height of the edges 32 is slightly less than the thickness of a rectangular copper slab 34 which is to be used as a base stock for making the copper pallets 14. The thickness of the copper slab 34 is preferably 30 to 60 mils. and its width will correspond to slightly greater than the length of the monoliths 18. The copper slab 34 is positioned within the recess 30 so that one corner thereof is situated in the corner of the recess and the sides of the copper slab abut the edges 32 of the recess. This provides proper alignment of the copper slab 34. The copper slab 34 may be held down in any convenient manner such as through use of vaccum (not shown) or by clamps (not shown). Silver epoxy 20 is then applied to the copper slab 34 in any convenient manner at selected locations. By way of example, a silk screening process may be used to apply the silver epoxy 20. An LED monolith 18 is then placed down upon the copper slab 34 at the locations of the silver epoxy 20. The area covered by the epoxy 20 will be somewhat smaller than the area of a monolith 18. The monolith 18 is now placed down, using a vaccum probe (not shown) and aligned, as for example through use of a microscope with a reference cross hair or target circles which match the LED sites on the monolith. The LED monolith can be placed on a copper slab 34 so that the slab will have a width that is approximately one mil greater than the length of the LED monolith 18. In this way, the modules would not protrude over the sides of the slab 34. A fixture consisting of a mechanical translation table, a lead screw and stepper motor drive and a microscope with an alignment reticule is used to place each monolith 18 upon the slab 34 in sequence with a precise distance between each monolith. This distance is determined by a program stepper motor which follows an assigned stepper pattern, i.e. an operator aligns the first monolith 18, indexes the slab 34 to the second position and so forth. This bar-monolith assembly is then placed in an oven to cure the silver epoxy and thus bind the monoliths 18 to the slab 34. The slab 34 is then placed into the same fixture 28 or a similar one to be cut into individual pallets. It is recognized that the cutting process could have occurred prior to the attachment of LED monolith 18 to pallet 14 and the attachment fixture designed to accept individual pallets as opposed to the copper slab 34. As is demonstrated in FIG. 4, the amount of overlap between the width of a copper pallet 14 and a monolith 18 is not critical; however, as stated previously the length of the pallet should be approximately 0.001 inches greater than the monolith. This is because the monoliths are laid end to end when forming an array and the LED sites 22 should be distributed uniformly across the array 10.

When the bar is cut, the dimension between the modules is closely tolerated, as for example, ±0.0005 inches. The resulting pallet is a closely tolerated building block that could be easily assembled in a straight array through use of a straight edge 35 as shown in FIG. 5. Silver epoxy 16 would be placed upon a substrate 12 as by silk screening. The individual pallets will be placed one at a time upon the substrate 12 at the location of the epoxy 16 with a one mil thick fluoroethylene spacer 36 placed therebetween to isolate each pallet electrically from the next. This assembly would then be placed in an oven to cure the silver epoxy. After curing the epoxy 16, the spacer 36 would be removed along with the straight edge.

Such fabrication of an LED array solves many problems. The LED monoliths are pre-aligned on an individual basis and can be retested as submonoliths. The shorting problem associated with cathodes 24 is eliminated and the monoliths 18 can be removed and repaired individually since a copper pallet is less brittle and can be removed in one piece.

The copper pallet serves several purposes. A copper pallet 14 can be stamped and/or blanked and/or machined with a much higher degree of accuracy and at a lower cost than can be accomplished with an LED monolith. The monolith is separated from its wafer by multiple cuts with a diamond blade with a variable kerf (material removed by the width of the blade). Thus the pallet forms a highly accurate brick with which to build the continuous wall of LEDs. In addition, the copper pallet 18 forms a highly conductive heat path to rapidly disperse heat generated at each LED site 22 when it is activated. Furthermore, the LED monolith/copper pallet 18 can be tested prior to final assembly into an array 10 much more easily, since the combination is much more robust and less subject to breakage through handling.

What is claimed is:

1. A method of producing a light emitting diode (LED) array, the steps comprise:
    placing an adhesive upon a plurality of metallic pallets, placing a monolith composed of a semiconductor material and having a plurality of LED sites thereon upon each of the metallic pallets so that adhesive is therebetween, curing the adhesive and securing the metallic pallets with LED monoliths thereon end-to-end upon a substrate.

2. The method of claim 1 wherein the monoliths are formed of a longitudinally extending member and the monoliths are longitudinally aligned and secured in tandem.

3. A method of producing a light emitting diode (LED) array, the steps comprising:
    placing and adhesive upon a metallic slab at a plurality of locations, placing a monolith comprising a semiconductor material and having a plurality of LED sites thereon upon the metallic slab at each adhesive location, curing the adhesive, cutting the metallic slab so as to segregate each monolith to thereby form a plurality of pallets, each with a monolith thereon, and securing a plurality of matallic pallets with monoliths thereon end-to-end upon a substrate.

4. The method of claim 3 wherein the monoliths are formed of a longitudinally extending member and the monoliths are longitudinally aligned and secured in tandem.

5. The method of claim 3 including the step of placing spacers between the monoliths as the monoliths are placed upon the metal slab and removing the spacers after the adhesive is cured.

* * * * *